(12) United States Patent
Takehara

(10) Patent No.: US 7,863,679 B2
(45) Date of Patent: Jan. 4, 2011

(54) SEMICONDUCTOR APPARATUS AND METHOD OF MANUFACTURING THE SAME

(75) Inventor: Kei Takehara, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 333 days.

(21) Appl. No.: 11/976,161

(22) Filed: Oct. 22, 2007

(65) Prior Publication Data
US 2008/0093665 A1    Apr. 24, 2008

(30) Foreign Application Priority Data
Oct. 23, 2006    (JP) .............................. 2006-287799

(51) Int. Cl.
H01L 29/78    (2006.01)
(52) U.S. Cl. ................. 257/332; 257/330; 257/334; 257/E29.262
(58) Field of Classification Search .............. 257/330, 257/332, 334, E29.262
See application file for complete search history.

(56) References Cited

U.S. PATENT DOCUMENTS

| | | | |
|---|---|---|---|
| 5,751,024 A * | 5/1998 | Takahashi | 257/139 |
| 6,172,398 B1 * | 1/2001 | Hshieh | 257/330 |
| 6,351,009 B1 | 2/2002 | Kocon et al. | |
| 6,844,591 B1 * | 1/2005 | Tran | 257/330 |
| 6,977,416 B2 * | 12/2005 | Nakazawa et al. | 257/330 |
| 7,368,344 B2 * | 5/2008 | Haller | 438/242 |
| 7,518,184 B2 * | 4/2009 | Tran | 257/330 |
| 2003/0227061 A1 * | 12/2003 | Yokogawa et al. | 257/379 |
| 2005/0082604 A1 | 4/2005 | Yoshimochi | |
| 2006/0027862 A1 * | 2/2006 | Nakazawa et al. | 257/330 |
| 2008/0246081 A1 * | 10/2008 | Li et al. | 257/331 |
| 2009/0179259 A1 * | 7/2009 | Wang et al. | 257/330 |

FOREIGN PATENT DOCUMENTS

JP    3489358    11/2003

* cited by examiner

*Primary Examiner*—Allan R Wilson
(74) *Attorney, Agent, or Firm*—McGinn IP Law Group, PLLC

(57) ABSTRACT

A vertical power MOSFET includes a semiconductor substrate including a trench, a gate electrode layer having a prescribed impurity concentration and being formed inside the trench, and a cap insulating layer having a lower impurity concentration than the impurity concentration of the gate electrode layer and covering the gate electrode layer to provide insulation.

14 Claims, 8 Drawing Sheets

SEMICONDUCTOR APPARATUS AND METHOD OF MANUFACTURING THE SAME

BACKGROUND OF THE INVENTION

1. Field of the Invention

The present invention relates to a semiconductor apparatus having a trench-gate structure and a method of manufacturing the same.

2. Description of Related Art

As an example of a semiconductor apparatus having a trench-gate structure according to a related art, a vertical power MOSFET is shown in FIG. 6. FIG. 6 is a vertical sectional view of a vertical power MOSFET 10 according to a related art.

Referring to FIG. 6, the vertical power MOSFET 10 includes an $n^+$ layer 20, an $n^-$ layer 30, a body p layer 40, a $p^+$ layer 50, source layers 60a and 60b, gate insulating films 70a and 70b, gate electrode layers 80a and 80b, cap oxide layers 90a and 90b as cap insulating layers, trenches 100a and 100b, a source electrode 110, and a drain electrode 120.

In the vertical power MOSFET 10, the body p layer 40 is formed above the $n^+$ layer 20 and the $n^-$ layer 30, which serve as a drain. Further, the $p^+$ layer 50 is formed on the surface of the body p layer 40.

The gate insulating films 70a and 70b are formed on the inner wall surfaces of the trenches 100a and 100b that are formed in prescribed positions. The gate electrode layers 80a and 80b, which are made of a polysilicon film, are formed inside the trenches. The top surfaces of the gate electrode layers 80a and 80b are covered with the cap oxide layers 90a and 90b.

In order to reduce the resistance (gate resistance) of the gate electrode layers 80a and 80b, a relatively high concentration of n-type impurity (e.g. phosphorus: P) is doped to the polysilicon film that fills the inside of each trench.

Consequently, the cap oxide layers 90a and 90b, which are formed by thermally oxidizing the surface of the doped polysilicon film, also contain a high concentration of n-type impurity (e.g. phosphorus: P).

On the surface of the body p layer 40, the source layers 60a and 60b are formed in contact with the gate insulating films 70a and 70b. The part of the body p layer 40 which is in contact with the gate insulating films 70a and 70b serves as a channel region.

On the front surface of the substrate, the source electrode 110 is formed in contact with the $p^+$ layer 50 and the source layers 60a and 60b. The drain electrode 120 is formed on the rear surface of the substrate.

In the vertical power MOSFET 10 having such a structure, the gate electrode layers 80a and 80b are electrically isolated from the source electrode 110 by the cap oxide layers 90a and 90b. Further, because this structure establishes source contact on the substrate surface without forming a trench for establishing source contact, it is suitable for cell shrinkage.

A method of manufacturing the vertical power MOSFET 10 having such a structure is described hereinafter with reference to FIGS. 7A to 7C and 8D to 8F. FIGS. 7A to 7C and 8D to 8F are sectional views showing the substantial part of the manufacturing process at each completion of fundamental steps. In FIGS. 7A to 7C and 8D to 8F, the $n^+$ layer 20 shown in FIG. 6 is not illustrated.

Referring first to FIG. 7A, a trench mask 150, which is made of a silicon nitride film ($Si_3N_4$), is formed above the $n^-$ layer 30 (drain) and the body p ($p^-$) layer 40. Then, arsenic (As) is implanted as shown in the dotted line in FIG. 7A in order to form a source layer. Then, side walls 160a and 160b are formed on both sides of the trench mask 150.

The side walls 160a and 160b are formed by depositing a $SiO_2$ film all over the substrate using a CVD process and then performing RIE (Reactive Ion Etching) to remove the $SiO_2$ film on the trench mask 150.

Referring next to FIG. 7B, the substrate is etched by RIE using the trench mask 150 and the side walls 160a and 160b as masks, thereby forming the trenches 100a and 100b.

In this step, a part of the implanted arsenic (As) remains under the side walls 160a and 160b without being removed.

Referring then to FIG. 7C, damage of the substrate, which is caused by the formation of the trenches, is recovered by performing sacrifice-oxidation and removing a sacrifice oxide film (not shown).

Due to heat treatment during the sacrifice-oxidation, a part of the remaining arsenic (As) is activated; as a result, first portions 61a and 61b, which are components of a ladder-like source layer, are formed.

After that, the inner wall surfaces of the trenches 100a and 100b are oxidized by heat treatment to thereby form the gate insulating films 70a and 70b. Due to the heat treatment, the first portions 61a and 61b of the source layer expand outward.

Referring further to FIG. 8D, each trench is filled with a polysilicon 80 that is doped with an n-type impurity (e.g. phosphorus: P) in order to reduce gate resistance.

Specifically, the polysilicon film 80 is deposited inside the trenches 100a and 100b and on the substrate surface by the CVD process, and then an unnecessary part is removed (etched back) by RIE.

Referring then to FIG. 8E, the surface of the doped polysilicon film that is filled inside the trenches 100a and 100b is thermally oxidized using the trench mask 150 as a mask to thereby form the cap oxide layers 90a and 90b. After that, the trench mask 150 is removed.

A non-oxidized part of the doped polysilicon film that is filled inside the trenches 100a and 100b thereby becomes the gate electrode layers 80a and 80b.

Because the cap oxide layers 90a and 90b cubically expand as the oxidation progresses, the top surfaces of the cap oxide layers 90a and 90b become higher than the top surface of the substrate. On the other hand, the under surfaces of the cap oxide layers 90a and 90b become lower than the top surface of the substrate. Accordingly, the thickness of the gate electrode layers 80a and 80b decreases.

Referring finally to FIG. 8F, a resist mask (not shown) having a prescribed pattern (an opening pattern that is equivalent to a second portion corresponding to a crossbar of the ladder-like source layer) is formed orthogonal to the trenches 100a and 100b, and arsenic (As) is implanted onto the substrate surface. Then, the implanted arsenic (As) is activated by heat treatment to thereby form a second portion 62, which is a component of the ladder-like source layer.

After that, side walls (not shown) to cover the first portions 61a and 61b are formed on both sides of the cap oxide layers 90a and 90b. Then, a p-type impurity (e.g. boron: B) is implanted onto the surface of the body p layer 40, and annealing is performed to thereby form the $p^+$ layer 50. Because the concentration of the n-type impurity of the second portion 62 is higher than the concentration of the implanted p-type impurity, there arises no problem.

Then, the side walls (not shown) are removed, and the source electrode 110 and the drain electrode 120 are formed on the front surface and the rear surface of the substrate, respectively. The vertical power MOSFET 10 is thereby completed. Such a vertical power MOSFET is disclosed in Japanese Patent No. 3489358, for example.

In the above vertical power MOSFET 10, the gate electrode layers 80a and 80b are formed by filling the trenches with a doped polysilicon that contains a relatively high concentration of impurity in order to reduce gate resistance. Consequently, the cap oxide layers 90a and 90b, which are formed by thermally oxidizing the surface of the doped polysilicon, also contain a high concentration of impurity.

If the cap oxide layers 90a and 90b contain such a high concentration of impurity, the high-concentration impurity diffuses from the substrate surface during the heat treatment and reaches a channel region through the source layers 60a and 60b, which can cause short-circuit between a source and a drain.

Further, when forming the cap oxide layers 90a and 90b by thermally oxidizing the surface of the doped polysilicon, the cap oxide layers 90a and 90b expand as the thermal oxidation progresses. Consequently, the positions of the under surfaces of the cap oxide layer 90a and 90b become lower, so that the thickness of the gate electrode layers 80a and 80b changes (decreases) accordingly. It is thus difficult to stably obtain a prescribed thickness of the gate electrode layers 80a and 80b.

Furthermore, if the thermal oxidation progresses excessively and the under surfaces of the cap oxide layer 90a and 90b become lower than the source layers 60a and 60b, it hampers the formation of a normal channel.

SUMMARY

In view of the foregoing, the present invention aims at providing a semiconductor apparatus and its manufacturing method that reduce the possibility that an impurity of a cap insulating layer diffuses and reaches a channel region to cause short-circuit between a source and a drain and that enable the reliable and stable obtainment of a prescribed thickness of a gate electrode layer and a cap insulating layer.

According to one aspect of the present invention, there is provided a semiconductor apparatus that includes a semiconductor substrate including a trench, a gate electrode layer having a prescribed impurity concentration and being formed inside the trench, and a cap insulating layer having a lower impurity concentration than the impurity concentration of the gate electrode layer and covering the gate electrode layer to provide insulation.

According to another aspect of the present invention, there is provided a method of manufacturing a semiconductor apparatus that includes forming a trench in a semiconductor substrate, forming a gate insulating film on an inner wall surface of the trench in the semiconductor substrate, forming a gate electrode layer made of a first conductive film having a prescribed impurity concentration inside the trench with a top surface being lower than a surface of the semiconductor substrate, forming a second insulating film inside the trench, and forming a second conductive film having a lower impurity concentration than the impurity concentration of the first conductive film inside the trench and on the surface of the semiconductor substrate.

The semiconductor apparatus of the present invention can reduce the possibility that an impurity of a cap insulating layer diffuses and reaches a channel region to cause short-circuit between a source and a drain. Further, a method of manufacturing the semiconductor apparatus of the present invention enables the reliable and stable obtainment of a prescribed thickness of a gate electrode layer and a cap insulating layer.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The present invention sets the impurity concentration of a cap insulating layer to cover a gate electrode layer to be lower than the impurity concentration of the gate electrode layer, thereby achieving the provision of a semiconductor apparatus and its manufacturing method that reduce the possibility that an impurity of a cap insulating layer diffuses and reaches a channel region to cause short-circuit between a source and a drain and that enable the reliable and stable obtainment of a prescribed thickness of a gate electrode layer and a cap insulating layer.

Figure 1:
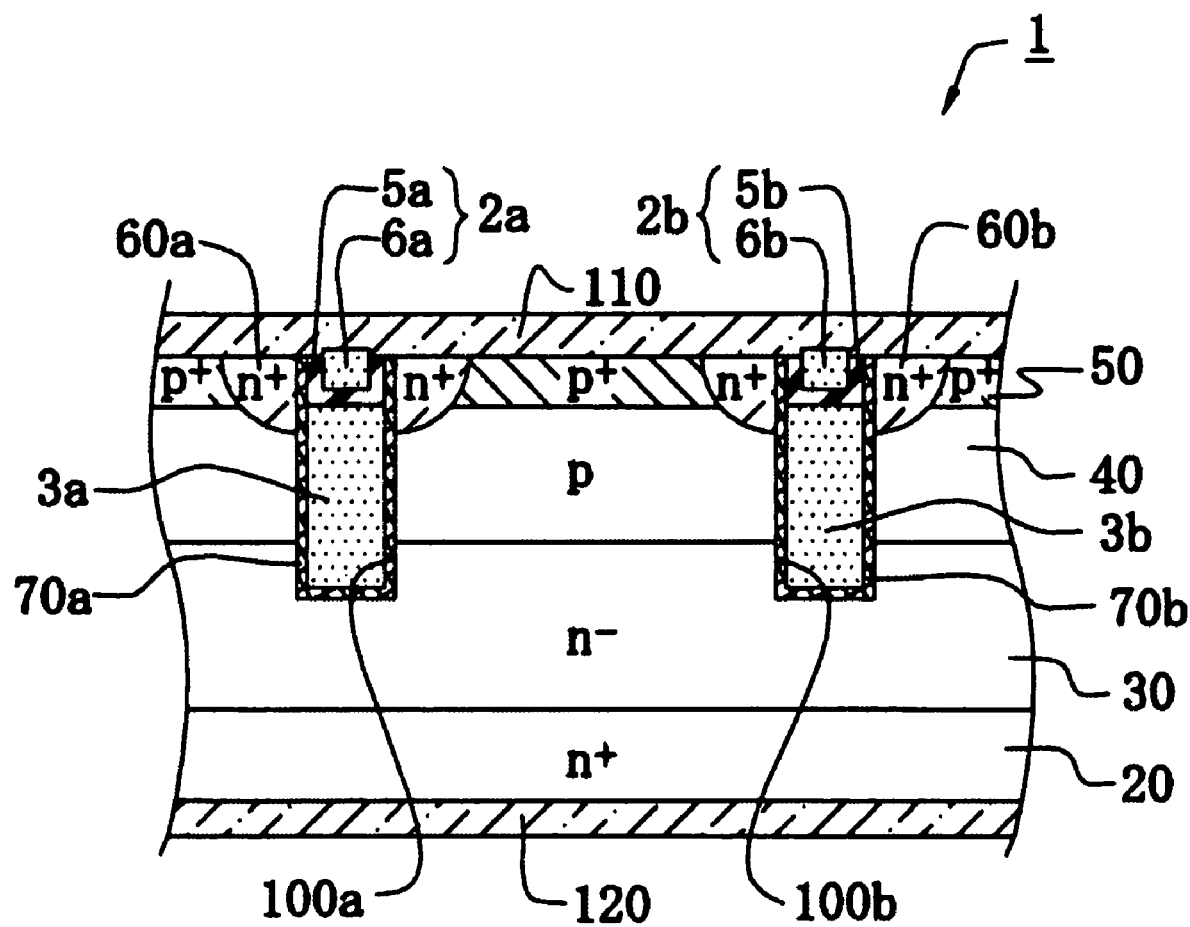
FIG. 1 is a vertical sectional view showing a vertical power MOSFET as an example of a semiconductor apparatus according to an embodiment of the present invention.
Figure 6:
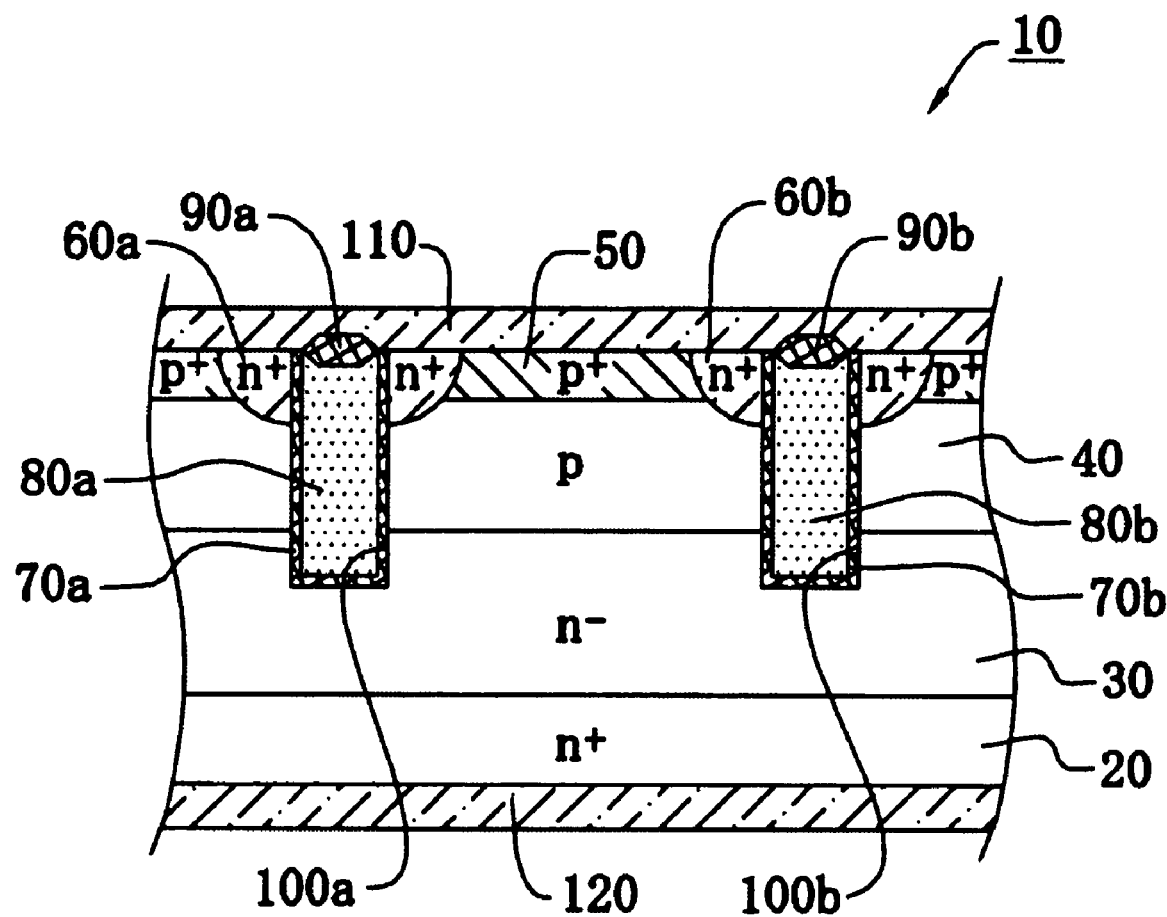
FIG. 6 is a vertical sectional view showing a vertical power MOSFET as an example of a semiconductor apparatus according to a related art.
Figure 7A:
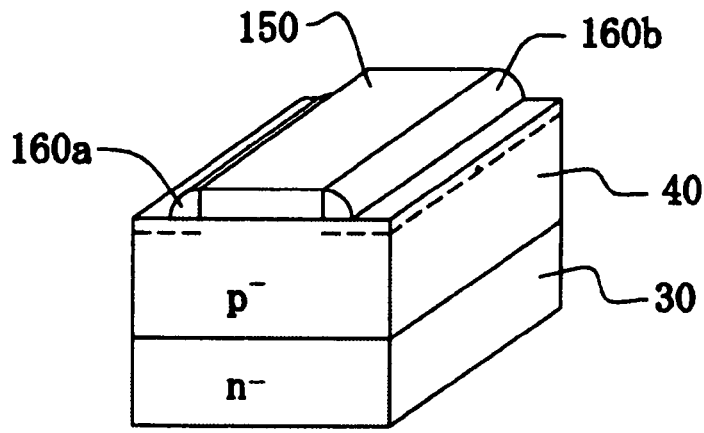
FIG. 7A is a sectional view showing a state at the completion of a fundamental step in the substantial process of manufacturing a vertical power MOSFET according to a related art.
Figure 7B:
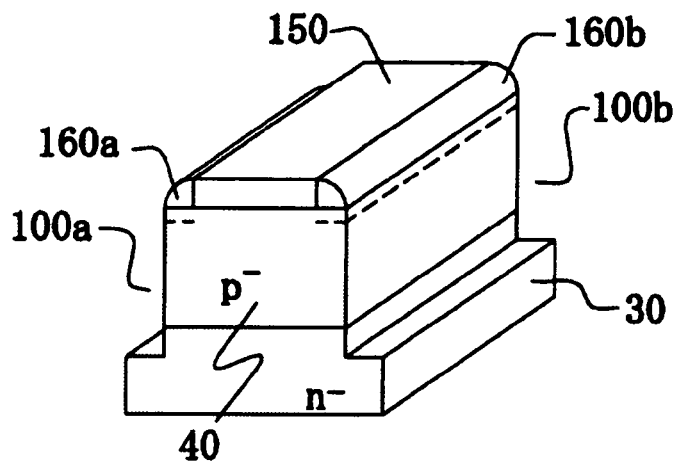
FIG. 7B is a sectional view showing a state at the completion of a fundamental step in the substantial process of manufacturing a vertical power MOSFET according to a related art.
Figure 7C:
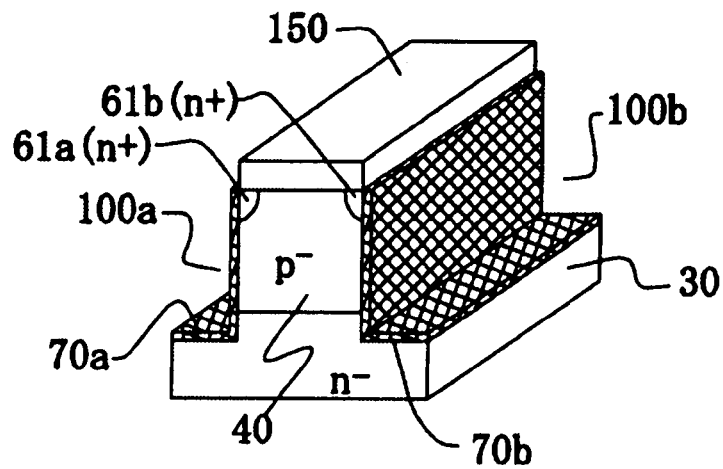
FIG. 7C is a sectional view showing a state at the completion of a fundamental step in the substantial process of manufacturing a vertical power MOSFET according to a related art.
Figure 8D:
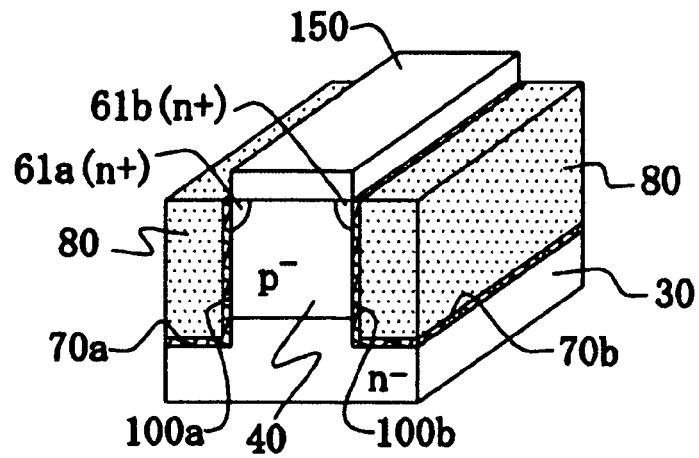
FIG. 8D is a sectional view showing a state at the completion of a fundamental step in the substantial process of manufacturing a vertical power MOSFET according to a related art.
Figure 8E:
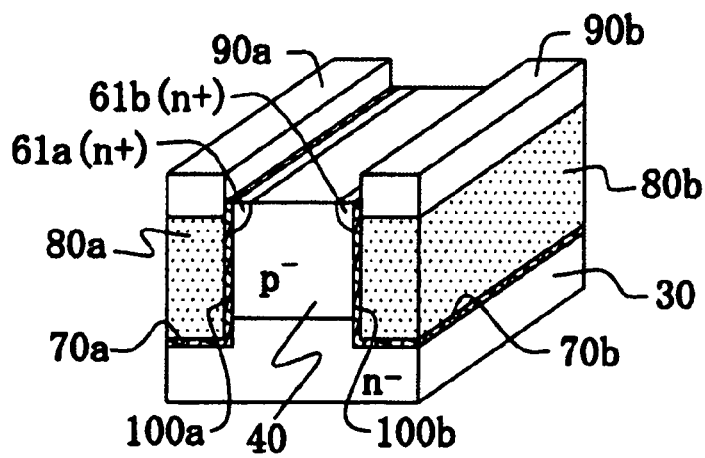
FIG. 8E is a sectional view showing a state at the completion of a fundamental step in the substantial process of manufacturing a vertical power MOSFET according to a related art.
Figure 8F:
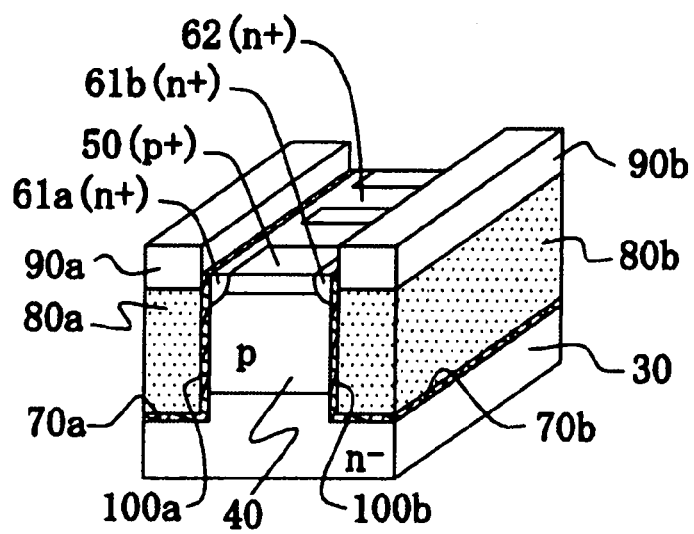
FIG. 8F is a sectional view showing a state at the completion of a fundamental step in the substantial process of manufacturing a vertical power MOSFET according to a related art.

FIG. 1 shows a vertical power MOSFET as an example of a semiconductor apparatus having a trench-gate structure according to an embodiment of the present invention. FIG. 1 is a vertical sectional view showing a vertical power MOSFET 1 of this embodiment. In FIG. 1, the same elements as in FIG. 6 are denoted by the same reference numerals.

Referring to FIG. 1, the vertical power MOSFET 1 of this embodiment includes cap oxide layers 2a and 2b as cap insulating layers, gate electrode layers 3a and 3b, NSG (Non-doped Silica Glass) layers 5a and 5b, polysilicon oxide layers 6a and 6b, an n$^+$ layer 20, an n$^-$ layer 30, a body p layer 40, a p$^+$ layer 50, source layers 60a and 60b, gate insulating films 70a and 70b, trenches 100a and 100b, a source electrode 110, and a drain electrode 120.

In the vertical power MOSFET 1, the body p layer 40 is formed above the n$^+$ layer 20 and the n$^-$ layer 30, which serve as a drain. Further, the p$^+$ layer 50 is formed on the surface of the body p layer 40.

The gate insulating films 70a and 70b are formed on the inner wall surfaces of the trenches 100a and 100b that are formed in prescribed positions. The gate electrode layers 3a and 3b, which are made of a polysilicon film, are formed inside the trenches 100a and 100b. The top surfaces of the gate electrode layers 3a and 3b are covered with the cap oxide layers 2a and 2b, respectively.

The cap oxide layers 2a and 2b are laminations of the NSG layers 5a and 5b and the polysilicon oxide layers 6a and 6b, respectively. The NSG layers 5a and 5b may be replaced with non-doped HTO (High Temperature Oxide) layers.

In order to reduce the resistance (gate resistance) of the gate electrode layers 3a and 3b, a relatively high concentration of n-type impurity (e.g. phosphorus: P) is doped to the polysilicon film that fills the inside of each trench.

On the other hand, the impurity concentration of the cap oxide layers 2a and 2b is lower than the impurity concentration of the gate electrode layers 3a and 3b. This suppresses the impurity of the cap oxide layers 2a and 2b from diffusing and reaching a channel region to cause short-circuit between the source and the drain.

The impurity concentration of the cap oxide layers 2a and 2b is one hundredth or below of the impurity concentration of the gate electrode layers 3a and 3b.

For example, if the impurity concentration of the gate electrode layers 3a and 3b is $1E^{16}$ atoms/cm$^3$, the impurity concentration of the cap oxide layers 2a and 2b is $1E^{14}$ atoms/cm$^3$ or below.

The top surfaces of the cap oxide layers 2a and 2b are higher than the top surface of the substrate. The under surfaces of the cap oxide layers 2a and 2b are lower than the top surface of the substrate.

On the surface of the body p layer 40, the source layers 60a and 60b are formed in contact with the gate insulating films 70a and 70b. The part of the body p layer 40 which is in contact with the gate insulating films 70a and 70b serves as a channel region.

On the front surface of the substrate, the source electrode 110 is formed in contact with the p$^+$ layer 50 and the source layers 60a and 60b. The drain electrode 120 is formed on the rear surface of the substrate.

In the vertical power MOSFET 1 having such a structure, the gate electrode layers 3a and 3b are electrically isolated from the source electrode 110 by the cap oxide layers 2a and 2b. Further, because this structure establishes source contact on the substrate surface without forming a trench for establishing source contact, it is suitable for cell shrinkage.

As described above, the impurity concentration of the cap oxide layers 2a and 2b is as low as one hundredth or below of the impurity concentration of the gate electrode layers 3a and 3b. This reduces the possibility that the impurity of the cap oxide layers 2a and 2b diffuses from the substrate surface during heat treatment and reaches a channel region through the source layers 60a and 60b to cause short-circuit between the source and the drain.

Further, the cap oxide layers 2a and 2b are laminations of the NSG layers 5a and 5b and the polysilicon oxide layers 6a and 6b, respectively. Thus, the NSG layers 5a and 5b in the lower layer suppress the diffusion of the impurity of the gate electrode layers 3a and 3b to the polysilicon oxide layers 6a and 6b.

A method of manufacturing the vertical power MOSFET 1 having the above structure is described hereinafter with reference to FIGS. 2A, 2B, 3C, 3D, 4E, 4F and 5G.

FIGS. 2A, 2B, 3C, 3D, 4E, 4F and 5G are sectional views showing the manufacturing method of the vertical power MOSFET 1, specifically, showing the state at each completion of steps in the process from trench formation to cap oxide layer formation according to an embodiment of the present invention. The other steps are the same as those in the related art described earlier and thus not described herein. The same elements as in FIGS. 6, 7A to 7C and 8D to 8F are denoted by the same reference numerals.

Figure 2A:
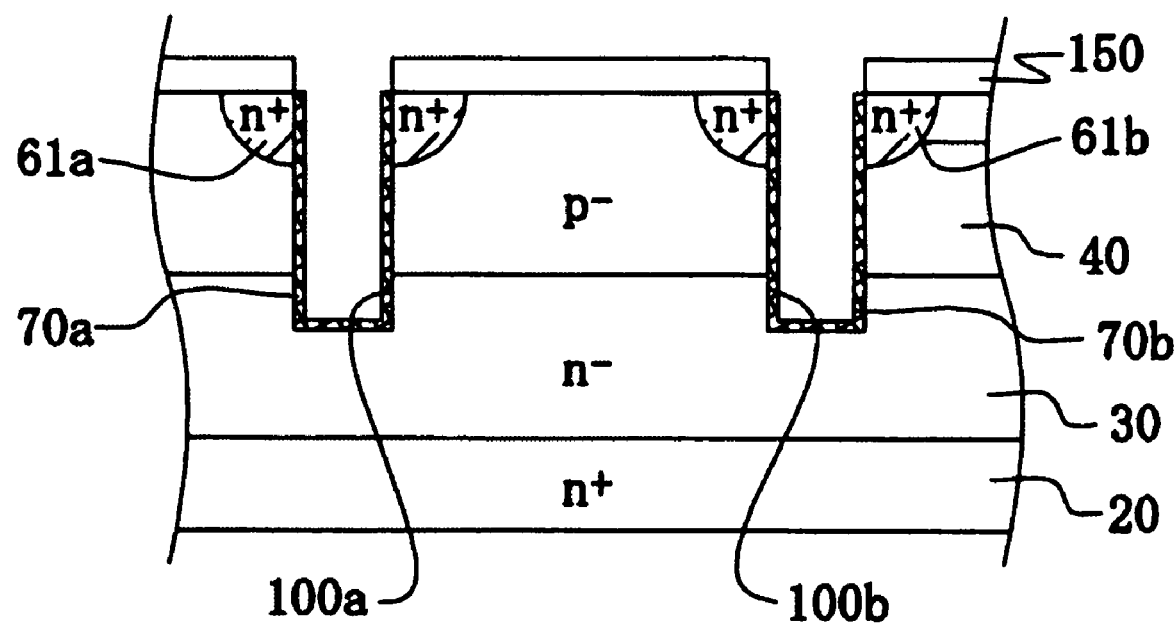
FIG. 2A is a sectional view showing a state at the completion of a step in the process from trench formation to cap oxide layer formation according to an embodiment of the present invention.

Referring first to FIG. 2A, the trenches 100a and 100b are formed to reach the n$^-$ layer 30 by RIE with the use of the trench mask 150, which is made of a silicon nitride film (Si$_3$N$_4$), formed on the substrate surface. Then, the gate insulating films 70a and 70b are formed on the inner wall surfaces of the trenches 100a and 100b by heat treatment. Due to the heat treatment, the first portions 61a and 61b of the source layer expand outward.

Figure 2B:
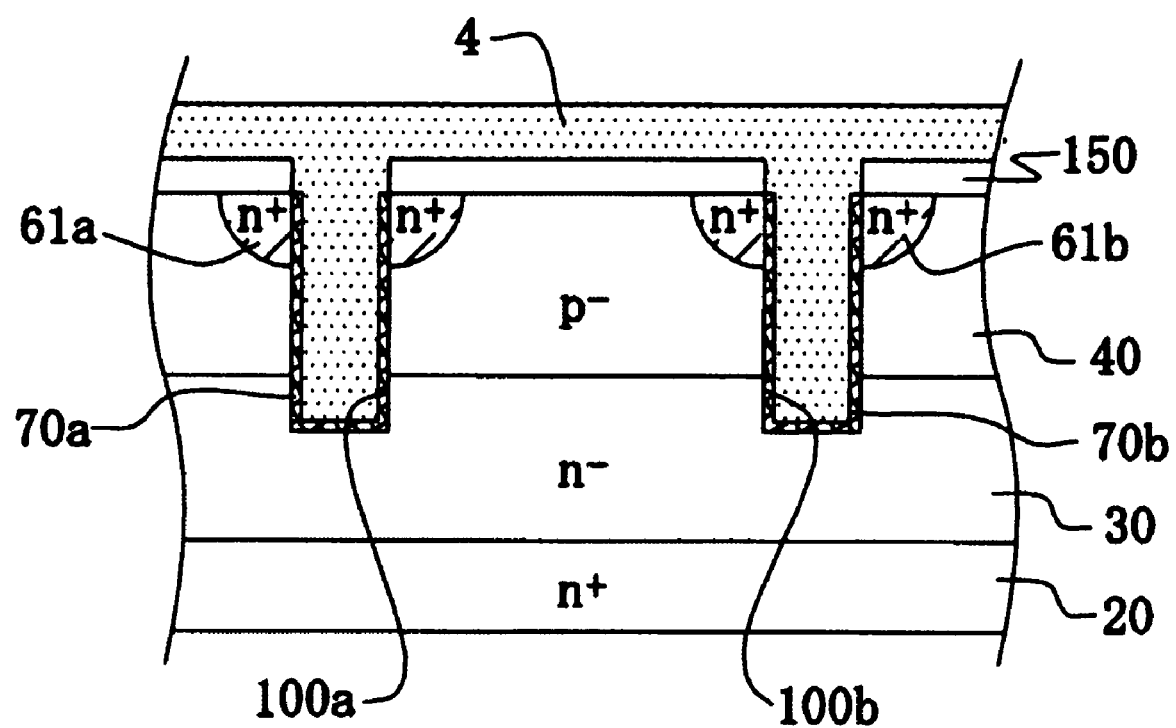
FIG. 2B is a sectional view showing a state at the completion of a step in the process from trench formation to cap oxide layer formation according to an embodiment of the present invention.

Referring next to FIG. 2B, a first polysilicon film 4 that is doped with a high concentration of n-type impurity (e.g. phosphorus: P; $1E^{16}$ atoms/cm$^3$) is deposited by the CVD process inside the trenches and on the substrate surface with the trench mask 150 remaining thereon.

The impurity is doped into the first polysilicon film 4 for the purpose of reducing gate resistance. The impurity may be introduced into the first polysilicon film 4 by phosphorus diffusion or ion injection after forming a non-doped polysilicon film.

Figure 3C:
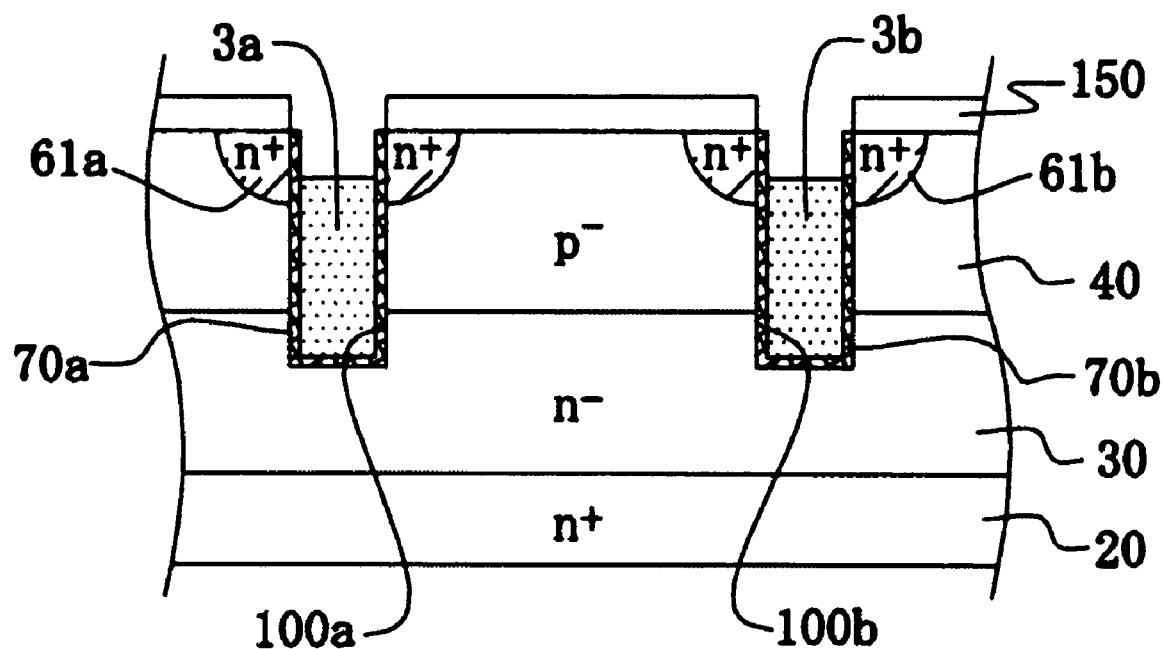
FIG. 3C is a sectional view showing a state at the completion of a step in the process from trench formation to cap oxide layer formation according to an embodiment of the present invention.

Referring then to FIG. 3C, an unnecessary part of the first polysilicon film is removed (etched back) by RIE.

Because the first polysilicon film 4 is over-etched so as not to remain on the trench mask 150, the upper part of the first polysilicon film inside the trenches 100a and 100b is depressed relative to the substrate surface. The first polysilicon film with a prescribed depression depth and a prescribed thickness is obtained by controlling the etch-back amount appropriately.

The gate electrode layers 3a and 3b, which is made of the first polysilicon film, whose top surfaces are lower than the substrate surface are thereby formed.

The top surfaces of the gate electrode layers 3a and 3b are set to be higher than the under surfaces of the first portions 61a and 61b, so that a channel region is formed normally.

Figure 3D:
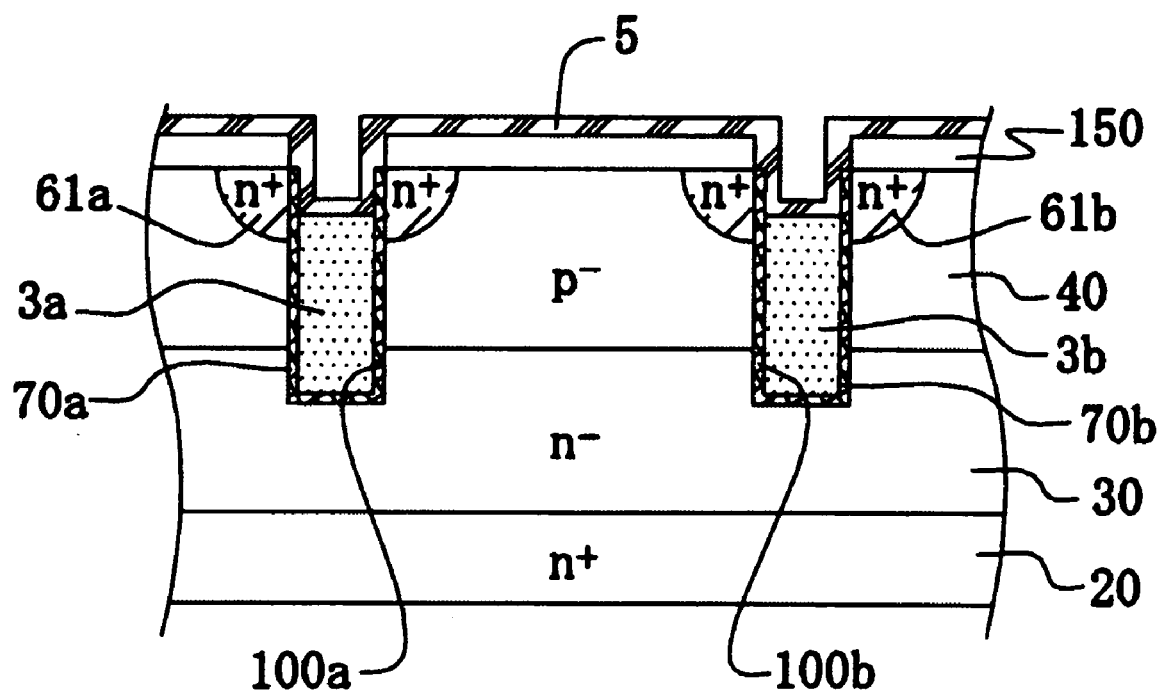
FIG. 3D is a sectional view showing a state at the completion of a step in the process from trench formation to cap oxide layer formation according to an embodiment of the present invention.

Referring then to FIG. 3D, the NSG film 5 as a second insulating film is deposited by the CVD process inside the trenches and on the substrate surface with the trench mask 150 remaining thereon. The thickness of the NSG film 5 may be about 10000 Å, for example.

Because the NSG film 5 is thin, the upper part of the NSG film 5 inside the trenches 100a and 100b is still depressed relative to the substrate surface.

Figure 4E:
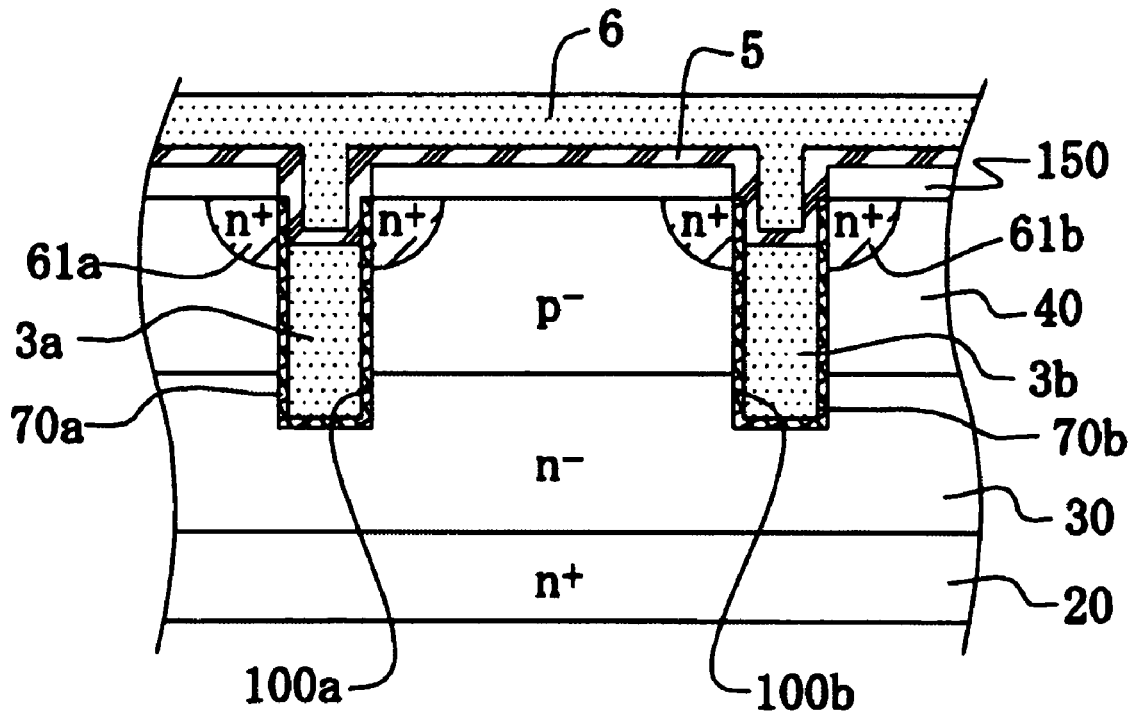
FIG. 4E is a sectional view showing a state at the completion of a step in the process from trench formation to cap oxide layer formation according to an embodiment of the present invention.

Referring further to FIG. 4E, a non-doped second polysilicon film 6 is deposited by the CVD process inside the trenches and on the substrate surface.

Although a non-doped polysilicon film is used for the second polysilicon film 6 in this example, the impurity concentration of the second polysilicon film 6 may be one hundredth or below of the impurity concentration of the gate electrode layers 3a and 3b.

Figure 4F:
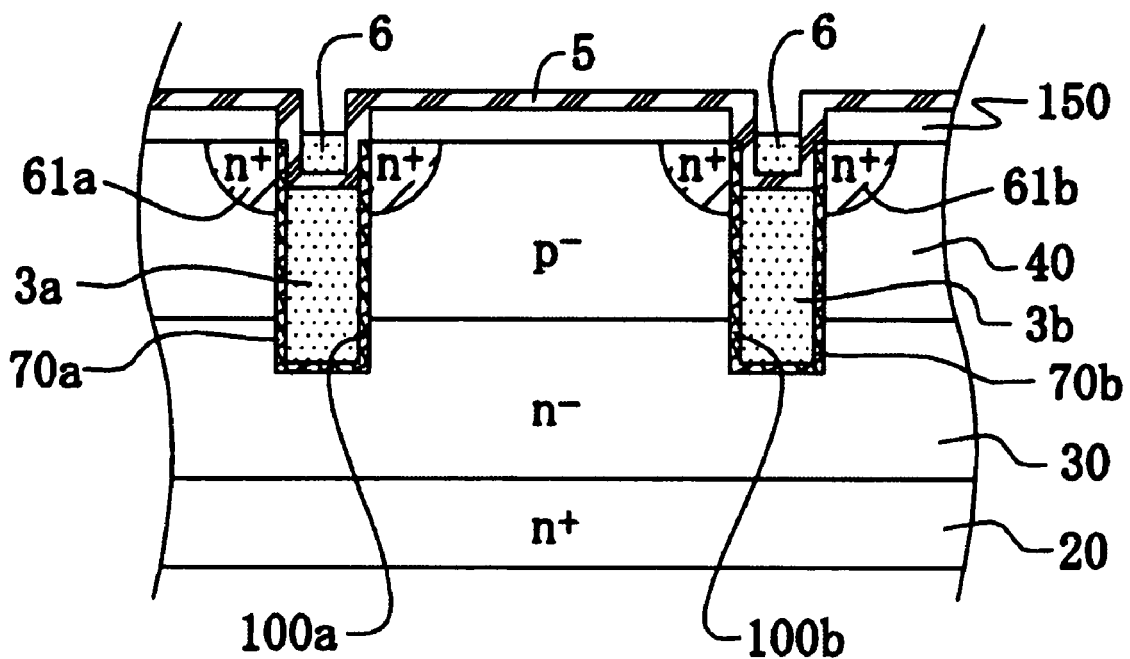
FIG. 4F is a sectional view showing a state at the completion of a step in the process from trench formation to cap oxide layer formation according to an embodiment of the present invention.

Referring then to FIG. 4F, an unnecessary part of the second polysilicon film 6 is removed (etched back) by RIE.

Because the second polysilicon film 6 is over-etched so as not to remain on the NSG film 5 on the substrate surface, the top surface of the second polysilicon film 6 that is formed inside each trench is lower than the surface of the NSG film 5 that is formed on the trench mask 150. However, the top surface of the second polysilicon film 6 is set to be higher than the substrate surface by controlling the etch-back amount.

A thick cap oxide layer that projects from the substrate surface is thereby obtained, thus providing adequate insulation coverage over the gate electrode layers 3a and 3b.

Figure 5G:
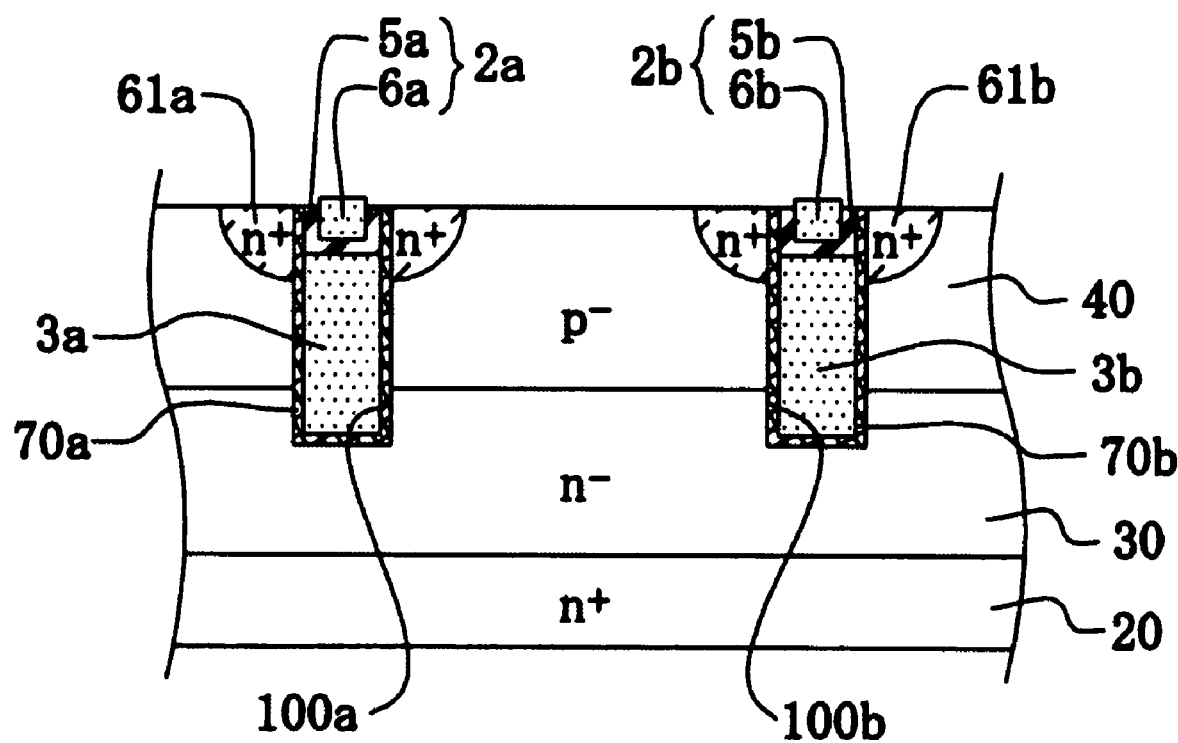
FIG. 5G is a sectional view showing a state at the completion of a step in the process from trench formation to cap oxide layer formation according to an embodiment of the present invention.

Referring finally to FIG. 5G, the NSG film on the substrate surface is removed by hydrofluoric acid (HF) to form the NSG layers 5a and 5b inside the trenches 100a and 100b, respectively. Because the polysilicon is not removed by hydrofluoric acid (HF), the second polysilicon film remains inside each trench. After that, the second polysilicon film is thermally oxidized to form the polysilicon oxide layers 6a and 6b. Then, the trench mask 150 is removed by hot phosphoric acid.

The top surfaces of the gate electrode layers 3a and 3b are thereby covered with the cap oxide layers 2a and 2b that serve as cap insulation layers composed of a lamination of the NSG layers 5a and 5b and the polysilicon oxide layers 6a and 6b, respectively.

The cap oxide layers 2a and 2b are non-doped. When introducing an impurity in subsequent steps, an impurity is introduced after covering the cap oxide layers 2a and 2b with a resist mask or the like. The cap oxide layers 2a and 2b thereby remain non-doped.

This reduces the possibility that the impurity of the cap oxide layers 2a and 2b diffuses from the substrate surface during heat treatment and reaches a channel region through the source layers 60a and 60b to cause short-circuit between a source and a drain.

Further, because the thickness of the gate electrode layers 3a and 3b is determined by the etch-back amount of the first polysilicon film 4 and not affected by the thermal oxidation amount of the second polysilicon film 6 that is formed with the NSG layers 5a and 5b interposed therebetween, a prescribed thickness of the gate electrode layers 3a and 3b can be obtained reliably and stably.

The present invention is applicable to a semiconductor apparatus having a trench-gate structure and a method of manufacturing the same so as to reduce the possibility that an impurity of a cap insulating layer diffuses and reaches a channel region to cause short-circuit between a source and a drain and to enable the reliable and stable obtainment of a prescribed thickness of a gate electrode layer and a cap insulating layer without the influence of a change in the thickness of the cap insulating layer.

It is apparent that the present invention is not limited to the above embodiments, but may be modified and changed without departing from the scope and spirit of the invention.

What is claimed is:

1. A semiconductor apparatus comprising:
   a semiconductor substrate including a trench;
   a gate electrode layer having a prescribed impurity concentration and being formed inside the trench;
   a source layer formed inside the semiconductor substrate and formed around the trench;
   a source electrode formed on a front surface of the substrate; and
   a cap insulating layer formed on the gate electrode layer and in an area which corresponds to an area where the gate electrode layer is formed such that the source layer and the source electrode are in direct contact with each other,
   wherein the cap insulating layer has a lower impurity concentration than the impurity concentration of the gate electrode layer, and at least a portion of the cap insulating layer is formed in the trench, and
   wherein the cap insulating layer comprises:
      a glass film formed in the trench on the gate insulating film and including a depressed portion; and
      an oxide layer formed in the trench on the depressed portion of the glass film.

2. The semiconductor apparatus according to claim 1, wherein the gate electrode layer comprises a polysilicon film.

3. The semiconductor apparatus according to claim 1, wherein the cap insulating layer comprises a lamination of an NSG (Non-doped Silica Glass) layer or an HTO (High Temperature Oxide) layer and a polysilicon oxide film.

4. The semiconductor apparatus according to claim 1, wherein the impurity concentration of the cap insulating layer is one hundredth or below of the impurity concentration of the gate electrode layer.

5. The semiconductor apparatus according to claim 1, wherein the semiconductor apparatus comprises a vertical MOSFET.

6. The semiconductor apparatus according to claim 1, further comprising:
   a gate insulating film formed on a wall of the trench, the gate electrode layer being formed on the gate insulating film,
   wherein the source layer is in contact with said gate insulating film.

7. The semiconductor apparatus according to claim 6, wherein a height of an upper surface of the gate electrode layer is greater than a height of a lower surface of the source layer.

8. The semiconductor apparatus according to claim 6, wherein the oxide layer projects above a surface of the substrate.

9. The semiconductor apparatus according to claim 8, wherein the oxide layer comprises a thermal oxide layer.

10. The semiconductor apparatus according to claim 1, wherein a height of an upper surface of the gate electrode layer is less than a height of a surface of the substrate.

11. The semiconductor apparatus according to claim 1, wherein a height of an upper surface of the cap insulating layer is greater than a height of an upper surface of the substrate, and the source electrode is formed on the cap insulating layer.

12. The semiconductor apparatus according to claim 1, wherein a height of a lower surface of the cap insulating layer is less than a height of an upper surface of the substrate.

13. The semiconductor apparatus according to claim 1, wherein the cap insulating layer is not formed over the source layer.

14. The semiconductor apparatus according to claim 1, wherein the cap insulating layer is directly interposed between the gate electrode layer and the source electrode.

* * * * *